(12) United States Patent
Peake et al.

(10) Patent No.: US 12,342,569 B2
(45) Date of Patent: Jun. 24, 2025

(54) TRENCH MOSFET

(71) Applicant: NEXPERIA B.V., Nijmegen (NL)

(72) Inventors: Steven Peake, Nijmegen (NL); Phil Rutter, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 435 days.

(21) Appl. No.: 17/747,381

(22) Filed: May 18, 2022

(65) Prior Publication Data
US 2022/0376108 A1 Nov. 24, 2022

(30) Foreign Application Priority Data

May 21, 2021 (EP) ..................................... 21175166

(51) Int. Cl.
*H10D 30/66* (2025.01)
*H10D 30/01* (2025.01)

(52) U.S. Cl.
CPC ....... *H10D 30/665* (2025.01); *H10D 30/0297* (2025.01); *H10D 30/668* (2025.01)

(58) Field of Classification Search
CPC ........... H01L 29/7811; H01L 29/66734; H01L 29/7813; H10D 30/665; H10D 30/668; H10D 30/0297
USPC ....................................................... 257/493
See application file for complete search history.

(56) References Cited

U.S. PATENT DOCUMENTS

| | | | |
|---|---|---|---|
| 4,941,026 A | 7/1990 | Temple | |
| 9,530,882 B1 * | 12/2016 | Hsieh | .................. H01L 29/7811 |
| 9,847,395 B2 | 12/2017 | Laforet et al. | |
| 2002/0185705 A1 * | 12/2002 | Saitoh | ................. H01L 29/7816 257/E29.066 |
| 2009/0039419 A1 * | 2/2009 | Zundel | .................. H01L 29/404 438/270 |
| 2011/0254088 A1 * | 10/2011 | Darwish | ............... H01L 29/407 257/341 |
| 2012/0043602 A1 | 2/2012 | Zeng et al. | |
| 2017/0110572 A1 * | 4/2017 | Zundel | .................. H01L 29/167 |
| 2018/0358449 A1 | 12/2018 | Zeng et al. | |
| 2020/0381253 A1 * | 12/2020 | Schulze | .............. H01L 29/0623 |

FOREIGN PATENT DOCUMENTS

EP 3511988 A1 7/2019

OTHER PUBLICATIONS

Extended European Search Report and Written Opinion for corresponding European application EP21175166.4 11 pages dated Nov. 22, 2021.

* cited by examiner

*Primary Examiner* — Igwe U Anya
(74) *Attorney, Agent, or Firm* — Ruggiero McAllister & McMahon LLC

(57) ABSTRACT

The present disclosure relates to a trench metal-oxide-semiconductor field-effect transistor, trench MOSFET, and to a method for manufacturing such transistors. In particular, the present disclosure relates to trench MOSFETs having deep trenches adjacent to the more shallow gate defining trench for obtaining a RESURF effect. According to the present disclosure, an ion implantation region of a charge type similar to that of the drift region is formed in the drift region. The ion implantation region extends below the deep trenches of the trench MOSFET and is vertically aligned with a base of the deep trenches.

15 Claims, 13 Drawing Sheets

TRENCH MOSFET

CROSS REFERENCE TO RELATED APPLICATION

This application claims the benefit under 35 U.S.C. § 119(a) of European Application No. 21175166.4 filed May 21, 2021, the contents of which are incorporated by reference herein in their entirety.

BACKGROUND OF THE DISCLOSURE

1. Field of the Disclosure

The present disclosure relates to a trench metal-oxide-semiconductor field-effect transistor, trench MOSFET, and to a method for manufacturing such transistors.

2. Description of the Related Art

Trench MOSFETs are known in the art. An example of a known trench MOSFET 100 is illustrated in FIG. 1. It comprises a silicon semiconductor substrate 1 of a first charge type, and an epitaxial layer 2 of a first charge type arranged on semiconductor substrate 1. A first trench 3 is formed in epitaxial layer 2. First trench 3 is covered on an inside thereof with a gate oxide 4 and is filled with a first polysilicon body 5. A pair of second trenches 6 is also formed in epitaxial layer 2. Second trenches 6 are arranged on opposite sides of first trench 3. Second trenches 6 are deeper than first trench 3. Furthermore, each second trench 6 is covered on an inside thereof with a liner oxide 7 and is filled with a second polysilicon body 8.

A source region 9 of a first charge type and a body region 10 of a second charge type are further formed in epitaxial layer 2. Epitaxial layer 2 comprises a drift region 11 of the first charge type arranged in between body region 10 and substrate 1. Source region 9 and body region 10 are each formed in between first trench 3 and each of the second trenches 6. Body region 10 is arranged in between source region 9 and drift region 11.

Typically, silicon substrate 1 and epitaxial layer 2 are n-type doped. Body region 10 typically corresponds to a p-well obtained by dopant implantation using p-type dopants. Source region 9 typically corresponds to an n-well obtained by dopant implantation using n-type dopants in the p-well corresponding to body region 10.

FIG. 1 illustrates a trench MOSFET 100 having a single unit cell 100A. Typically, trench MOSFET 100 comprises a plurality of such unit cells 100A arranged adjacent to each other. For example, unit cell 100A can be repeated in a lateral direction such that adjacent unit cells 100A touch each other. In such configuration, trench MOSFET 100 comprises a parallel arrangement of a plurality of first trenches 3, each of the plurality of first trenches 3 being arranged in between a respective pair of second trenches 6. First polysilicon bodies 5 in first trenches 3 are electrically connected to each other, and second polysilicon bodies 8 in second trenches 6 are electrically connected to each other. More in particular, first polysilicon bodies 5 are electrically connected to a gate contact of the trench MOSFET. Similarly, second polysilicon bodies 6 are electrically connected to a source contact of the trench MOSFET. The source contact is also electrically connected to source regions 9.

In FIG. 1, one or more dielectric layers 12 are provided on top of each unit cell. Furthermore, metal traces 13 connect to source region 9 and polysilicon bodies 8. Typically, the unit cells are elongated having a substantially constant cross section as illustrated in FIG. 1. At the edges of the trench MOSFET, a gate contact is formed that connects to polysilicon bodies 5 of the unit cells. Similarly, a source contact is formed that connects to metal traces 13. The drain contact of the trench MOSFET is formed on the backside of substrate 1.

The trench MOSFET shown in FIG. 1 uses a reduced surface field, RESURF, effect to obtain high drain-source breakdown voltages. For break-down voltages in the 150V range, a very deep trench etch in excess of 10 μm is required for second trenches 6. In addition, a 1 μm thick deposited liner oxide 7 is required in second trenches 6 with a tight process control to maintain the RESURF condition between second trenches 6. It is worth elaborating at this point that the drain-source potential is supported entirely across liner oxide 7, wherein base 6A of second trench 6 sees almost 90% of the applied drain-source potential. The remaining 10% is dropped in epitaxial layer 2.

The sidewalls of second trenches 6 are not vertical but are inclined relative to substrate 1. Consequently, having deep second trenches 6 increases the pitch between neighboring unit cells thereby increasing the on-state resistance of the trench MOSFET.

Achieving the required level of control to make the process repeatable, reliable, and financially viable, is challenging at the 150V drain-source breakdown voltage rating. Due to this, manufactures have sought to ease the process control by using a bottom assist layer 14. This is illustrated in FIG. 2.

In the trench MOSFET shown in FIG. 2, the doping concentration in the region between bases 6A of second trenches 6 and substrate 1 is lower than in the remaining part of drift region 11. A typical doping profile is shown in FIG. 3. In this FIG., five different regions can be identified. A first region R1, corresponds to n-type source region 9, a second region R2 to p-type body region 10, a third region R3 to n-type drift layer 11, a fourth region R4 to n-type bottom assist layer 14, and a fifth region R5 to n-type substrate 1. In FIG. 2, region R4 extends between 7 and 10.5 μm.

Compared to the trench MOSFET shown in FIG. 1, by incorporating a bottom assist layer 14, a significant ease of process is obtained that results in better manufacturing conditions and wider process windows. Furthermore, bottom assist layer 14 enables the use of shallower second trenches 6 and a thinner liner oxide 7 for the same drain-source breakdown voltage as the drain-source potential that is supported across the base of liner oxide 7 has reduced significantly near breakdown.

FIG. 4 illustrates that from the 170V drain-source voltage being supported across the unit cell near breakdown, only 125V is supported across liner oxide 7 in base 6A of second trench 6, with the remaining 45V being supported across bottom assist layer 14. In FIG. 4, L1 marks the transition between liner oxide 7 and bottom assist layer 14, and L2 the transition between epitaxial layer 2 and substrate 1. It is further noted that the potential inside polysilicon body 8 is 0V.

Despite the advantages mentioned above, there is a process window that is of concern and that is the alignment between base 6A of second trench 6 and bottom assist layer 14. This alignment is indicated using arrow A1 in FIG. 2. Achieving optimal performance requires balancing between the thickness of epitaxial layer 2, the thickness of bottom assist layer 14 indicated using arrow A2 in FIG. 2, and the depth of second trenches 6.

At the end of processing, the thermal budget 'grades' the transition between bottom assist layer 14 and the remaining part of epitaxial layer 2. Bottom assist layer 14 is grown by the manufacturer of the silicon wafer. The doping profile of such wafers is subject to process tolerances. In addition, the trench depth window for second trenches 6 is approximately +/−0.6 μm for a thickness of epitaxial layer 2 of about 10 μm. In such case, bottom assist layer 14 has a thickness of approximately 3.4 μm with a maximum doping concentration of $2.05e16$ cm-3.

SUMMARY

It is an object of the present disclosure to provide a trench MOSFET in which comparable drain-source breakdown voltages can be obtained as with devices using a bottom assist layer albeit with a wider process window.

According to the present disclosure, this object is achieved using the trench MOSFET as defined in claim 1 that is characterized in that the trench MOSFET comprises an ion implantation region of the first charge type formed in the drift region, extending below the second trenches, and being vertically aligned with a base of the second trenches.

According to the present disclosure, the ion implantation region is created via dopant implantation into the base of the second trenches thereby self-aligning the ion implantation region to the second trenches.

The ion implantation process is followed by a driving-in step causing the implanted dopants to diffuse laterally and vertically. Consequently, the ion implantation region may also extend between the second trenches near the base of the second trenches. The above mentioned driving-in step typically comprises subjecting the wafer to elevated temperatures causing the implanted dopants to migrate through the epitaxial layer.

The ion implantation region may comprise a first ion implantation sub-region extending away from one second trench among the pair of second trenches, and a second ion implantation sub-region extending away from the other second trench among the pair of second trenches, wherein the first and second ion implantation sub-regions are contiguous. For example, the first ion implantation sub-region may comprise dopants of the second charge type that have been implanted through and laterally diffused away from the base of said one second trench among the pair of the second trenches, and the second ion implantation sub-region may comprise dopants of the second charge type that have been implanted through and laterally diffused away from the base of said the other second trench among the pair of the second trenches. The contiguity of the first and second ion implantation sub-regions may be achieved by a driving-in step as described above.

An average net dopant concentration in the ion implantation region can be lower than in a remaining part of the drift region. Here, the net concentration can be computed using the difference between the dopant concentration of the first type obtained after epi-growth and the dopant concentration of the second type obtained using the abovementioned ion implantation process. For example, an average doping concentration in the drift region outside of the ion implantation region can be at least 5 times greater than an average doping concentration in the ion implantation region, more preferably at least 10 times.

The ion implantation region of the first charge type formed in the drift region may extend below the second trenches at least up to an interface between the epitaxial layer and the substrate.

The substrate may comprise a silicon substrate of the first charge type. Additionally or alternatively, the first charge type can be n-type and the second charge type p-type, or vice versa. The source regions can be electrically connected to a source contact of the trench MOSFET, and the first polysilicon body to a gate contact. Furthermore, the second polysilicon bodies can be electrically connected to the source contact.

Typically, the trench MOSFET comprises a parallel arrangement of a plurality of the first trenches, wherein each of the plurality of first trenches is arranged in between a respective pair of the second trenches. In this case, the first polysilicon bodies in the first trenches can be electrically connected to each other, and the second polysilicon bodies in the second trenches can be electrically connected to each other.

According to a further aspect, the present disclosure provides a method for manufacturing a trench MOSFET, comprising a) providing a semiconductor substrate with an epitaxial layer of a first charge type arranged thereon, and b) forming a pair of second trenches in the epitaxial layer. In a next step c) a liner oxide is deposited that covers an inside of the second trenches. Next, in step d), a second polysilicon body is provided, e.g. by deposition, in each of the second trenches. In step e), a first trench is formed in the epitaxial layer in between the second trenches, the second trenches being deeper than the first trench.

As a next step f), a gate oxide is provided that covers an inside of the first trench. This is followed in step g) by providing a first polysilicon body in the first trench.

The method of the present disclosure is characterized by, before providing the second polysilicon bodies, implanting dopants of the second charge type through a base of one second trench among the pair of second trenches thereby forming a first ion implantation sub-region and simultaneously implanting dopants of the second charge type through a base of the other second trench among the pair of second trenches thereby forming a second ion implantation sub-region, and by performing a driving-in step to allow the implanted dopants to laterally diffuse away from the bases of the second trenches thereby deforming the first and second ion implantation sub-regions such that these sub-regions become contiguous. The driving-in step is preferably performed directly after the implantation process and may comprise an annealing step.

Step b) may comprise a step b1) of providing a masking layer on the epitaxial layer and patterning the masking layer, and a step b2) of etching the second trenches in the epitaxial layer through openings in the masking layer. In addition, step b1) may comprise a step b11) of providing a masking layer on the epitaxial layer, a step b12) of providing a photoresist layer on the masking layer, and patterning the photoresist layer, and a step b13) of etching the openings in the masking layer through openings in the patterned photoresist layer. Furthermore, step b11) may comprise thermally growing a silicon oxide layer on the epitaxial layer and depositing a silicon nitride layer on the grown silicon oxide layer.

Additionally or alternatively, step b) may comprise a step b3) of forming a sacrificial oxide layer on an inside of the formed second trenches before performing implanting the dopants of the second charge type through the bases of the second trenches. Such sacrificial layer may prevent or limit channeling effects from occurring during the implantation process of the dopants of the second charge type. The sacrificial layer can be a silicon oxide layer, preferably a thermally grown silicon oxide layer.

An average net dopant concentration in the ion implantation region is preferably lower than in a remaining part of the drift region. For example, an average doping concentration in the drift region outside of the ion implantation region is at least 5 times greater than an average doping concentration in the ion implantation region, more preferably at least 10 times.

The substrate may comprise a silicon substrate of the first charge type, and/or the first charge type is n-type and the second charge type p-type, or vice versa.

The method may further comprise a step h), in which the epitaxial layer is implanted using dopants of the second charge type for forming a body region of the second type between the first trench and each of the second trenches. Here, the body region corresponds to a well of the second charge type in the epitaxial layer of the first charge type. After having formed the body region, a drift region of the first charge type can be identified in the epitaxial layer that is arranged in between the body region and the substrate.

The method may further comprise a step i), in which the epitaxial layer is implanted using dopants of the first charge type for forming a source region between the first trench and each of the second trenches. Here, the source region corresponds to a well of the first charge type in the abovementioned well of the second charge type. Moreover, the body region is arranged in between the source region and the drift region.

The method may further comprise a step j), in which a gate contact is provided that is electrically connected to the first polysilicon body and a source contact is provided that is electrically connected to the second polysilicon bodies and the source regions. The gate and source contacts can be simultaneously formed using a metal deposition or sputtering process.

BRIEF DESCRIPTION OF THE DRAWINGS

Next, the present disclosure will be described using the appended drawings, wherein.

DETAILED DESCRIPTION

Figure 5A:
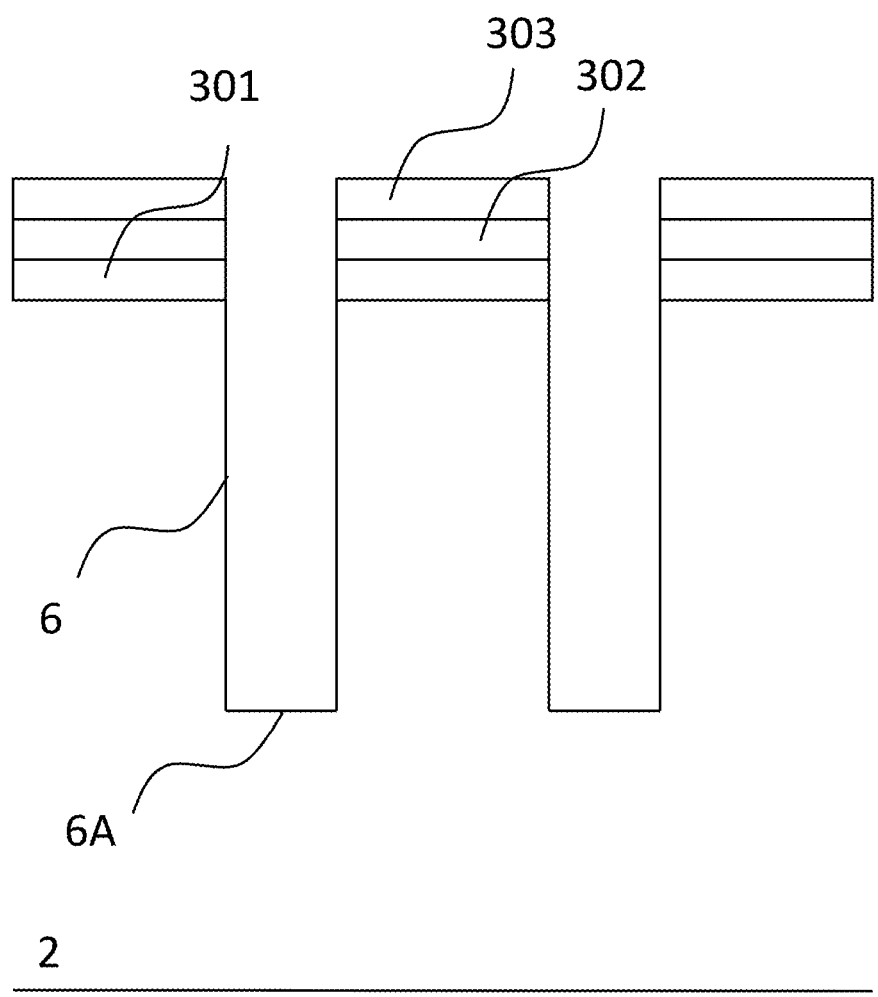
FIGS. 5A-5I illustrate a process for manufacturing a trench MOSFET in accordance with the present disclosure.

Now referring to FIG. 5A, a silicon wafer is provided having an n-type substrate 1 with a doping concentration in a range between 4.0-7.5e19 cm-3. On top of substrate 1, an n-type epitaxial layer 2 has been grown with a doping concentration in a range between 1.0-3.0e16 cm-3.

A silicon dioxide layer 301 is thermally grown on epitaxial layer 2. Thereafter, a silicon nitride layer 302 is deposited on silicon dioxide layer 301. This latter layer is covered by a photoresist layer 303 that is subsequently patterned. Through the openings in photoresist layer 303, silicon nitride layer 302 and silicon dioxide layer 301 are etched using a dry etching or wet-chemical etching process, or a combination thereof. Thereafter, trenches 6 will be etched in epitaxial layer 2 through the openings in layers 301, 302, 303. After this etching step, the situation as shown in FIG. 5A is obtained.

Figure 5B:
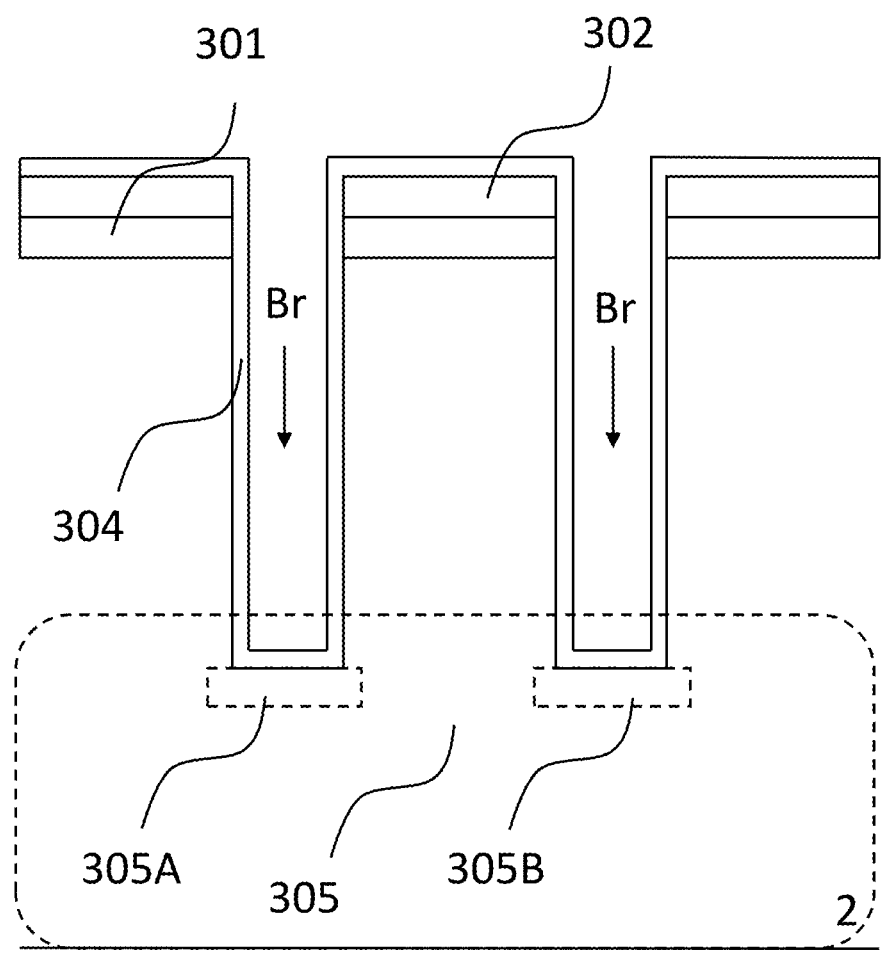

Now referring to FIG. 5B, photoresist layer 303 is stripped and a sacrificial silicon dioxide layer 304 is thermally grown. Then, the wafer is subjected to a boron implantation process in which sacrificial layer 304 prevents or limits channeling effects. The implantation process will result in ion implantation sub-regions 305A, 305B being formed that each comprise the implanted boron dopants. Following the implantation process, the wafer is subjected to a driving-in step, e.g. an annealing step, causing the implanted boron dopants to migrate through epitaxial layer 2 thereby changing regions 305A, 305B to become contiguous and forming ion implantation region 305. After the driving-in step, the situation as shown in FIG. 5B is obtained. Typically, the doping concentration in the n-type ion implantation region 305 is lower than that of the surrounding epitaxial layer 2 due to the counter-doping, and ranges between 1.0 and 3.0e15 cm-3. Furthermore, ion implantation region 305 preferably extends up to the interface between epitaxial layer 2 and silicon substrate 1. However, embodiments are equally possible in which ion implantation region 305 does not extend up to this interface.

Figure 5C:
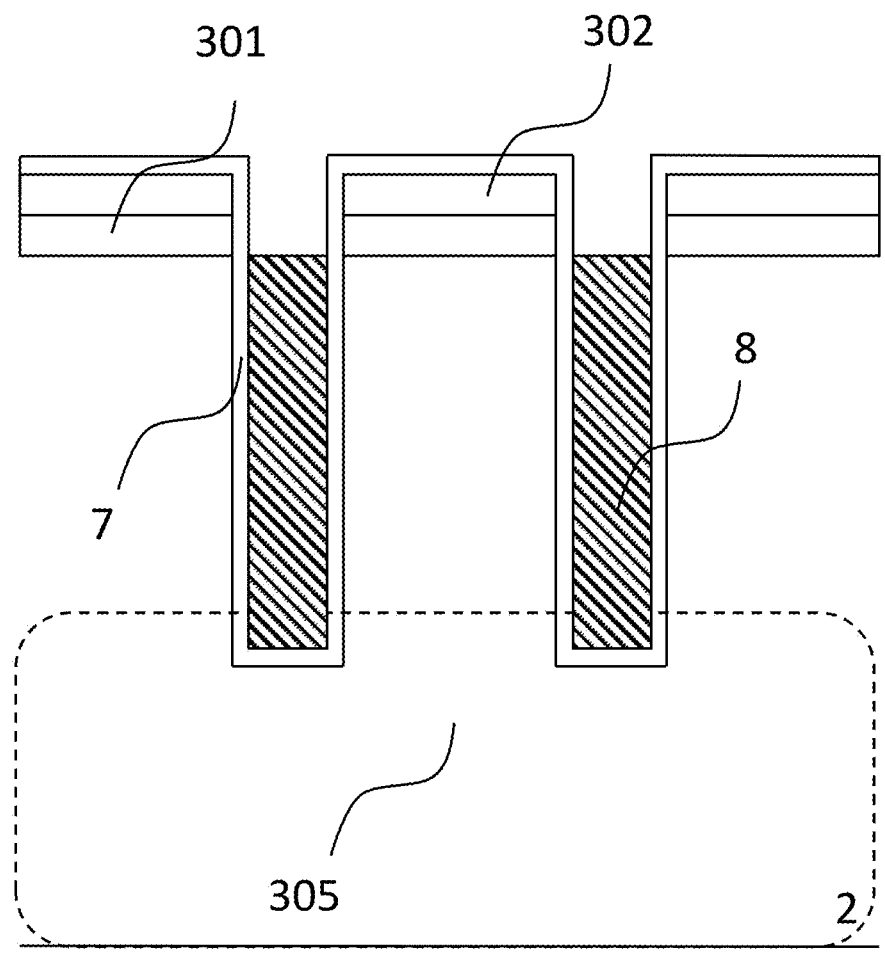

Now referring to FIG. 5C, sacrificial silicon dioxide layer 304 is etched, e.g. using wet-chemical etching process. Next, a liner silicon oxide layer 7 is deposited over the wafer that fills the inside of trenches 6. A polysilicon layer is deposited that is subsequently etched back in trenches 6 thereby forming polysilicon bodies 8. After this last etch, the situation as shown in FIG. 5C is obtained.

Figure 5D:
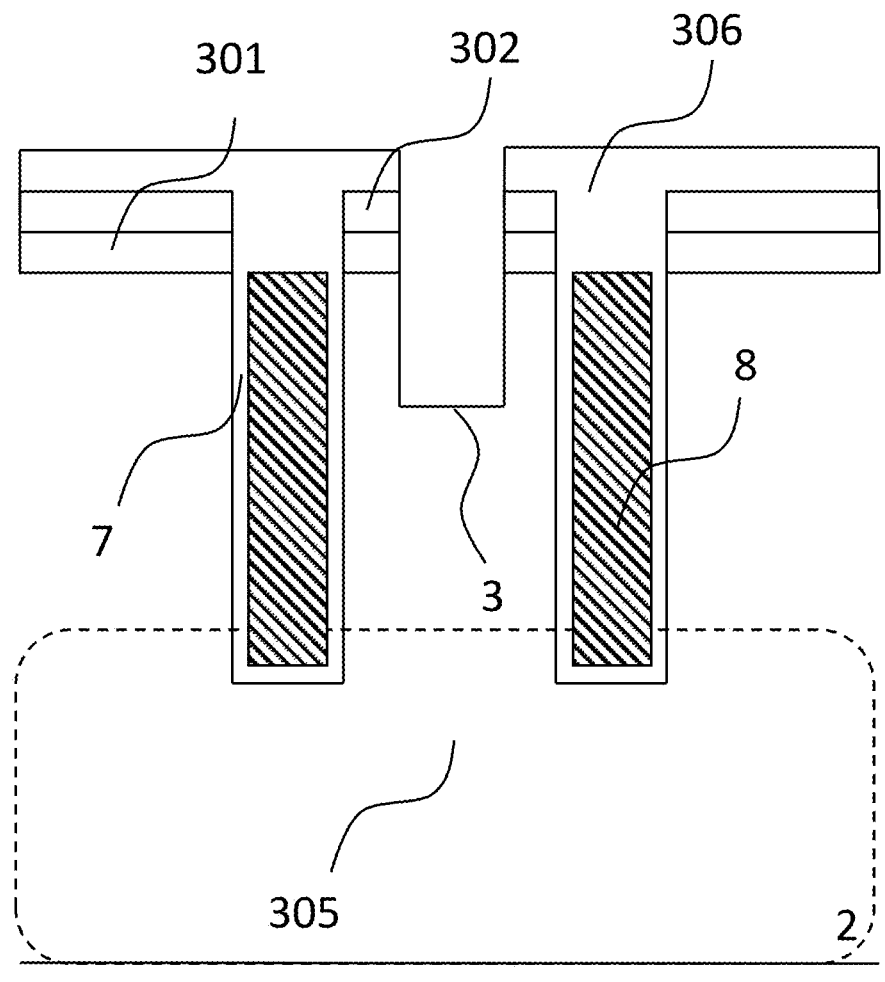

Now referring to FIG. 5D, liner oxide layer 7 is etched, and a new photoresist layer 306 is applied and patterned. Through the openings in photoresist layer 306, silicon nitride layer 302 and silicon dioxide layer 301 are etched using a dry etching or wet-chemical etching process, or a combination thereof. Thereafter, trenches 3 will be etched in epitaxial layer 2 through the openings in layers 301, 302, 306. After this etch the situation as shown in FIG. 5D is obtained.

Figure 5E:
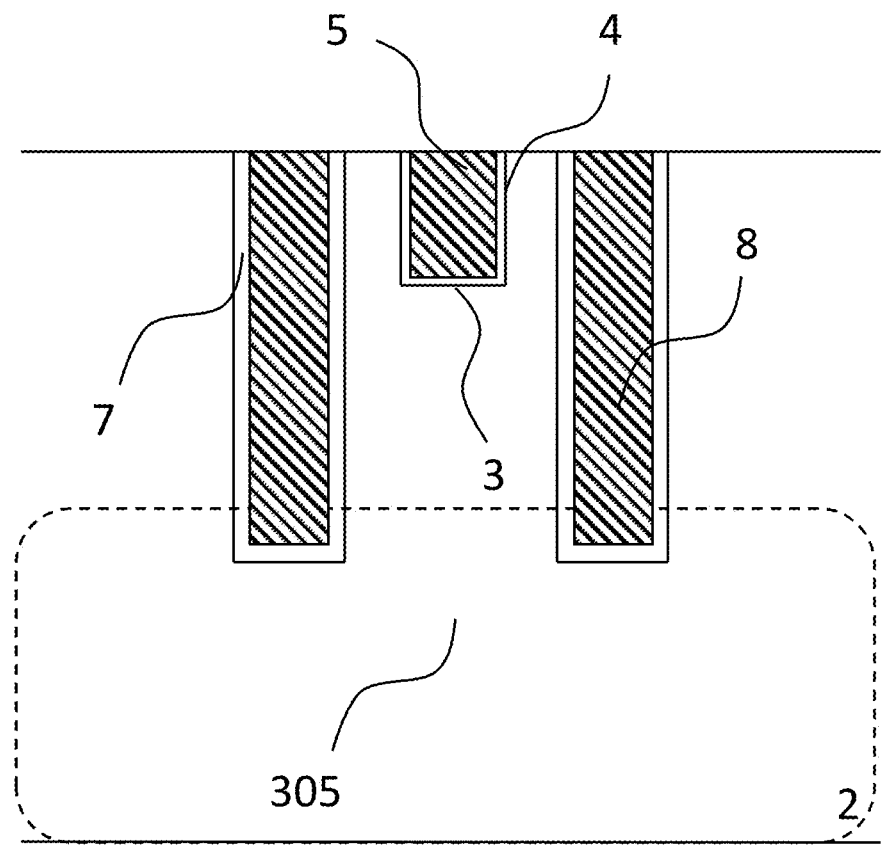

Now referring to FIG. 5E, layers 301, 302, 306 are stripped. As a next step, a gate oxide layer 4 is thermally grown after which a polysilicon layer is deposited. This latter layer is etched back into trench 3 thereby forming a polysilicon body 5. After etching, gate oxide layer 4 will be etched and the situation shown in FIG. 5E is obtained.

Figure 5F:
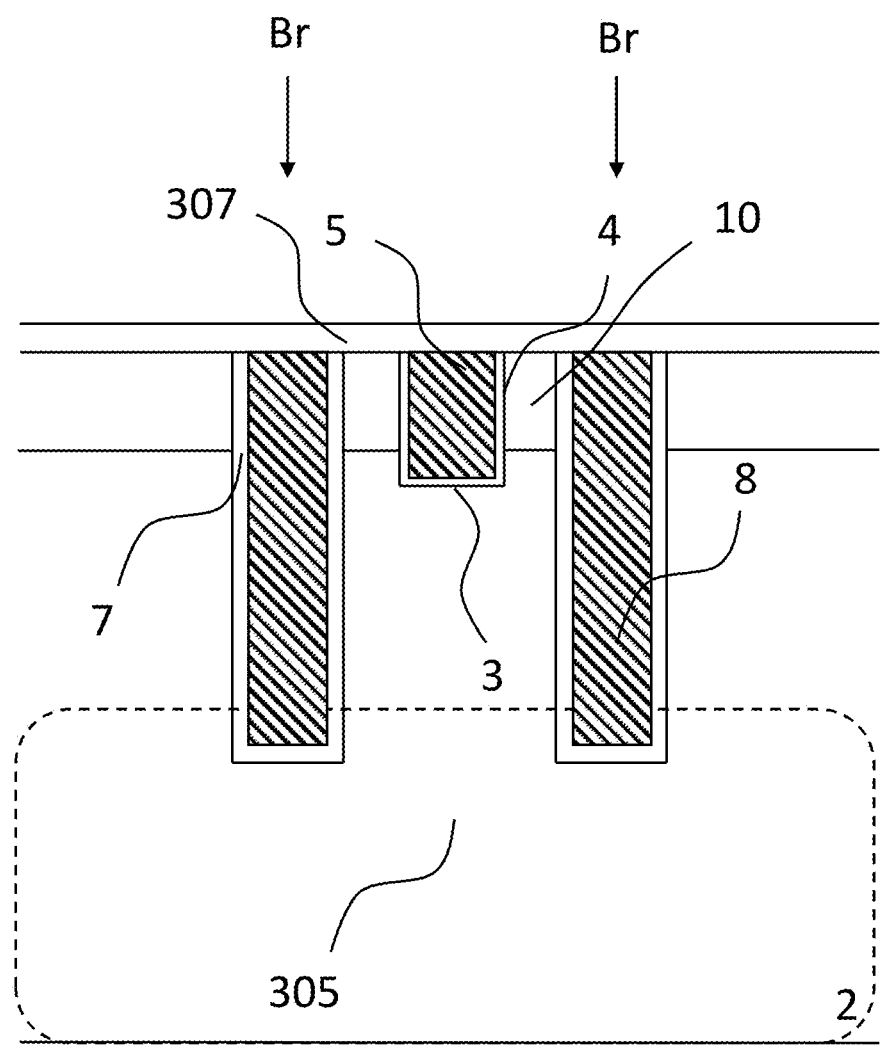

Now referring to FIG. 5F, as a next step, a silicon oxide 307 is thermally grown. Next, the wafer is subjected to a blanket implantation using boron dopants and a subsequent body annealing step. This will result in the formation of a p-type well referred to as body region 10 as shown in FIG. 5E. Typically, the net doping concentration inside body region 10 ranges between 10 and 13e16 cm-3.

Figure 5G:
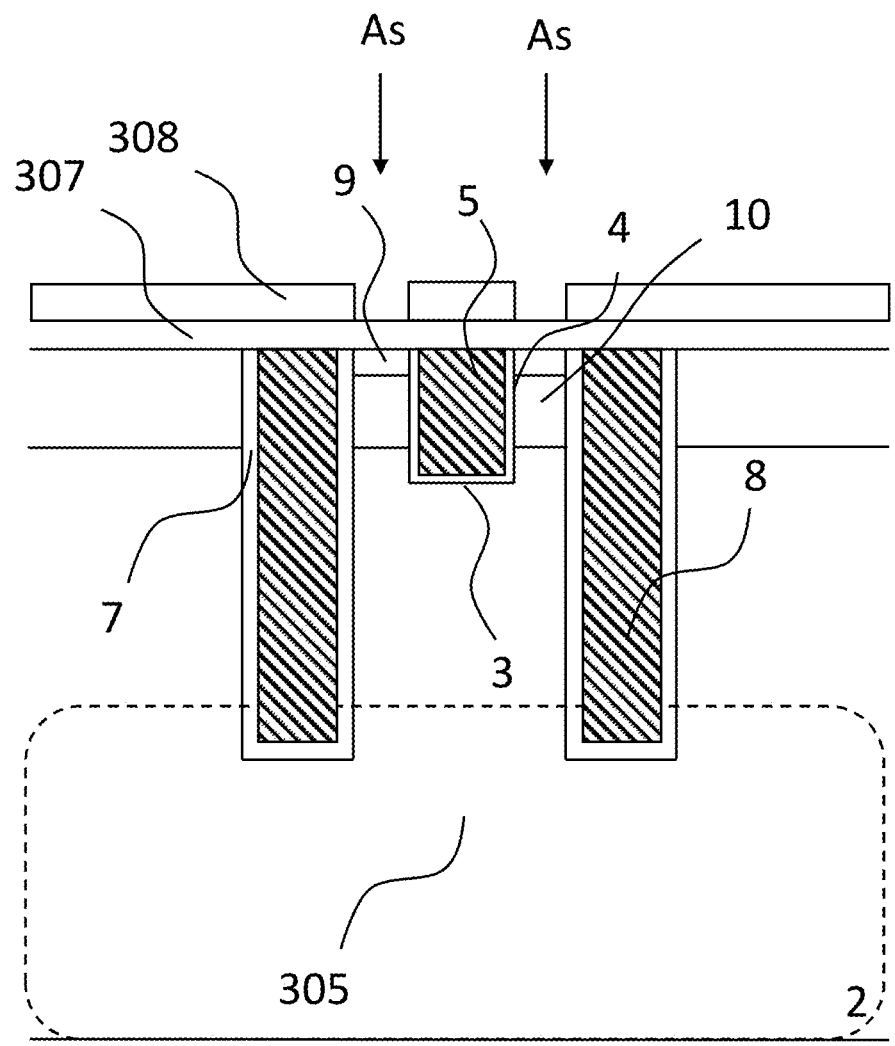

Now referring to FIG. 5G, as a next step, a photoresist layer 308 is applied and patterned. Arsenic dopants are then introduced through openings in photoresist layer 308 for forming an n-type source region or well 9 in previously formed p-type well/body region 10.

Figure 5H:
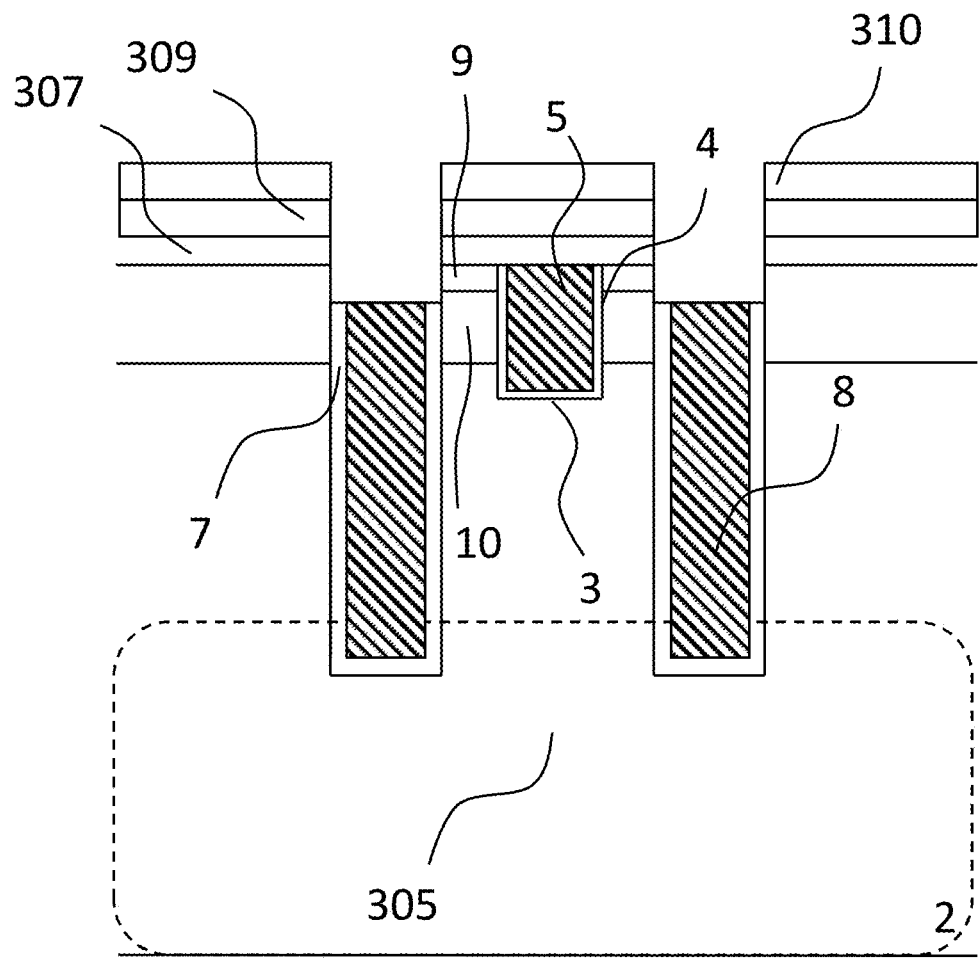

Now referring to FIG. 5H, as a next step, photoresist layer 308 is stripped and a tetraethyl orthosilicate (TEOS) oxide 309 is deposited. On top of oxide 309, a photoresist layer 310 is applied and patterned. Through the openings in photoresist layer 310, oxide 309, oxide 307, and liner oxide 7 are etched. Subsequently, polysilicon body 8 is etched back. After this last etching step, the situation as shown in FIG. 5H is obtained.

Figure 5I:
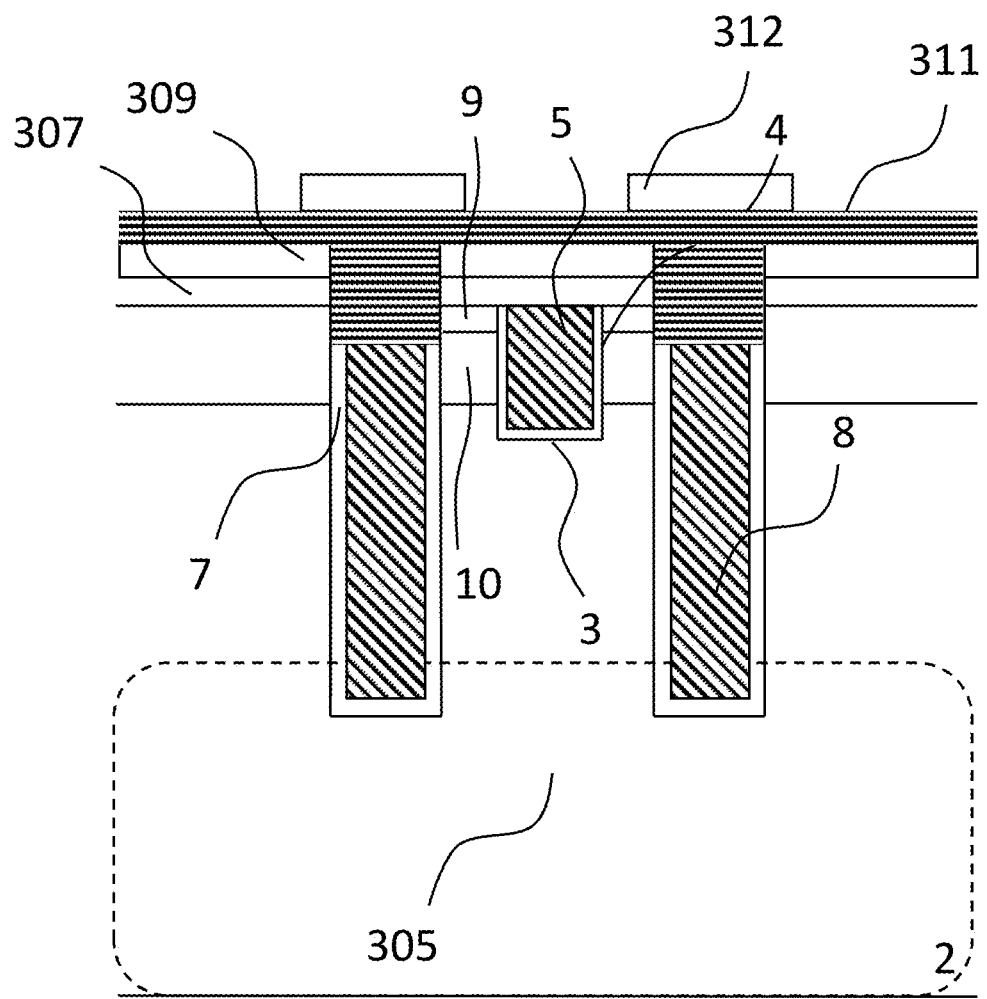
Figure 6:
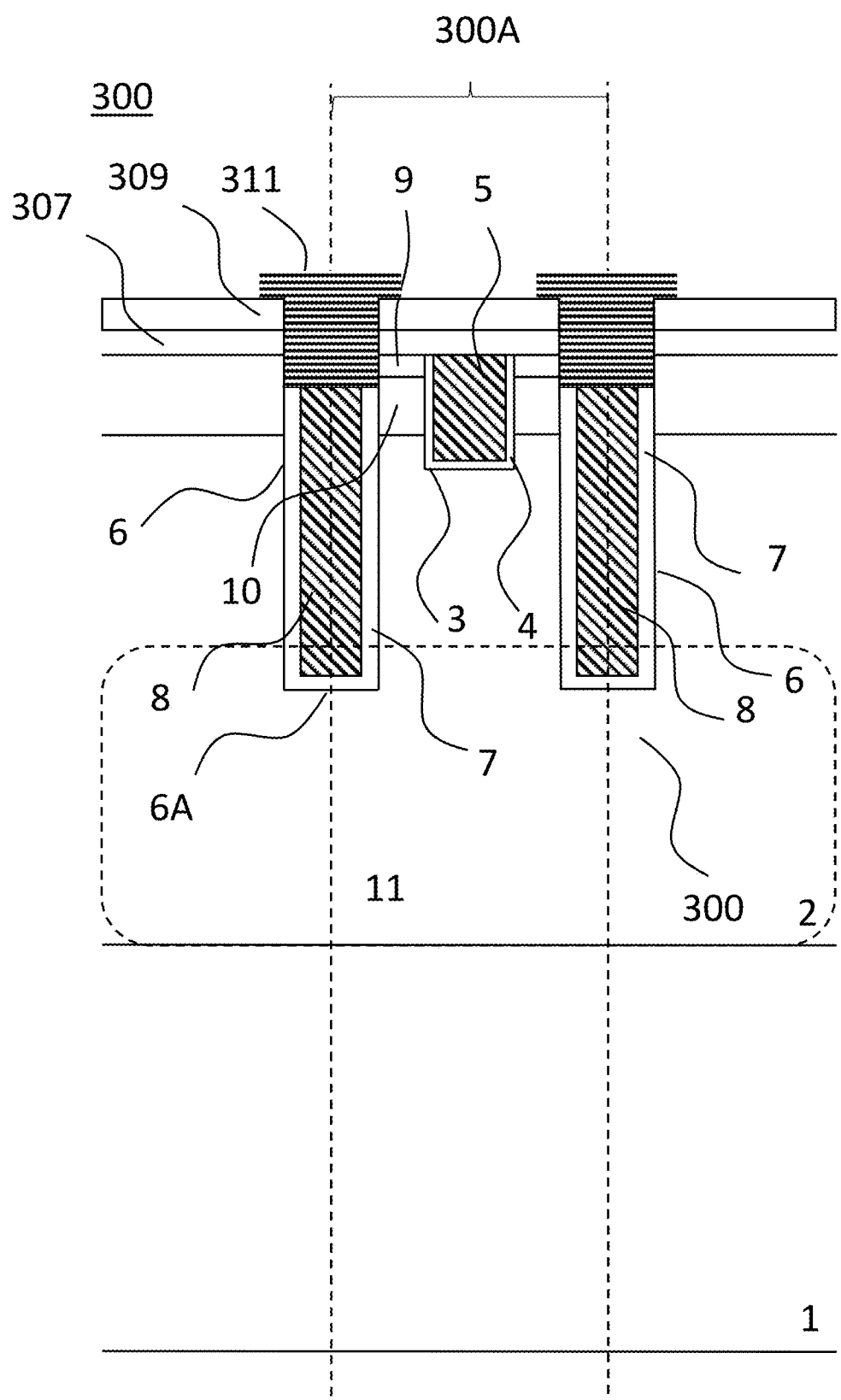
FIG. 6 illustrates a trench MOSFET in accordance with the present disclosure.

Now referring to FIG. 5I, as a next step, a metal layer 311, such as aluminum, is sputtered or evaporated. Thereafter, a photoresist layer 312 is applied and patterned resulting in the situation as shown in FIG. 5I. As a final step, metal 311 not covered by photoresist layer 312, is etched and photoresist layer 312 is stripped resulting in the situation shown in FIG. 6.

Figure 1:
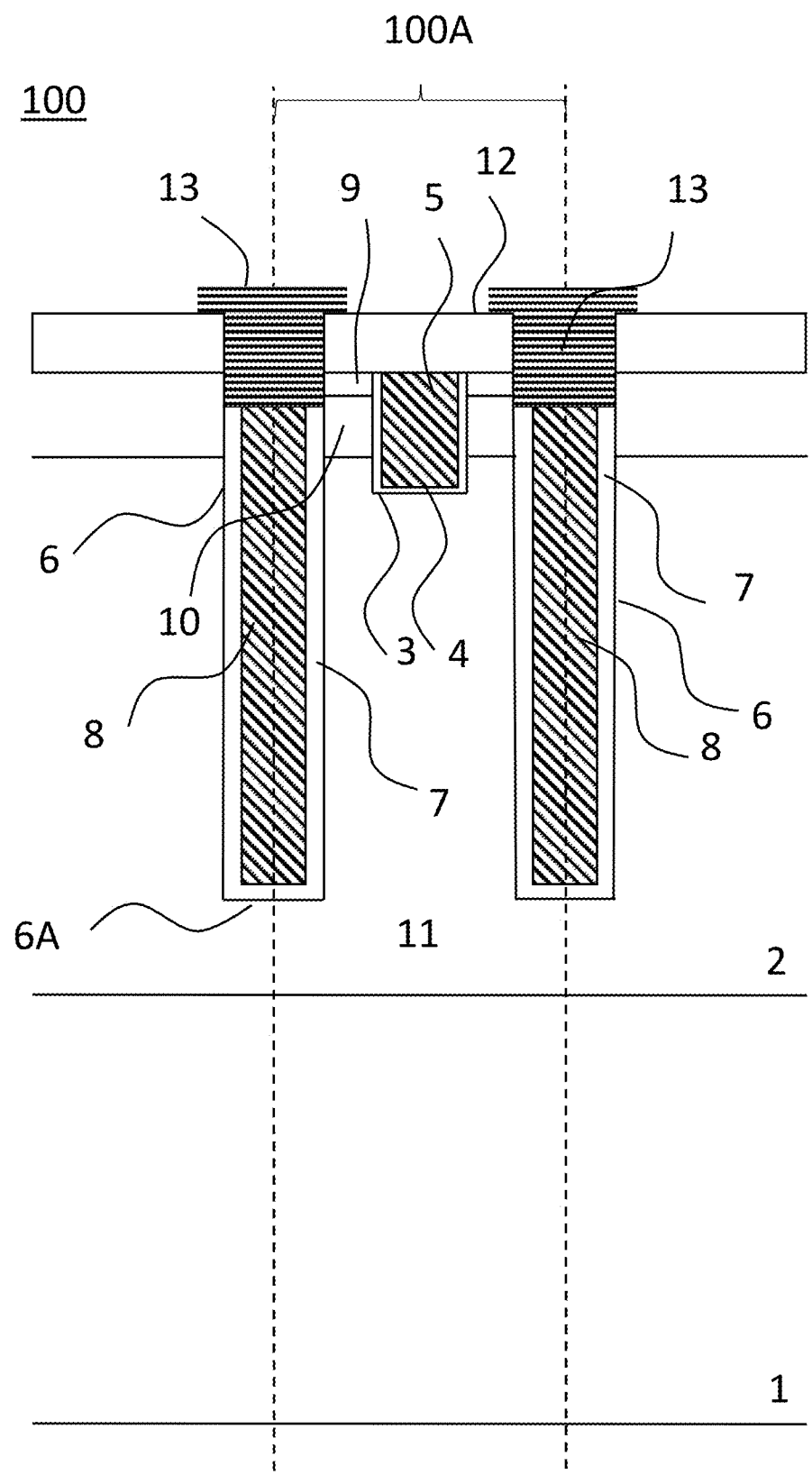
FIG. 1 illustrates a first known trench MOSFET.
Figure 2:
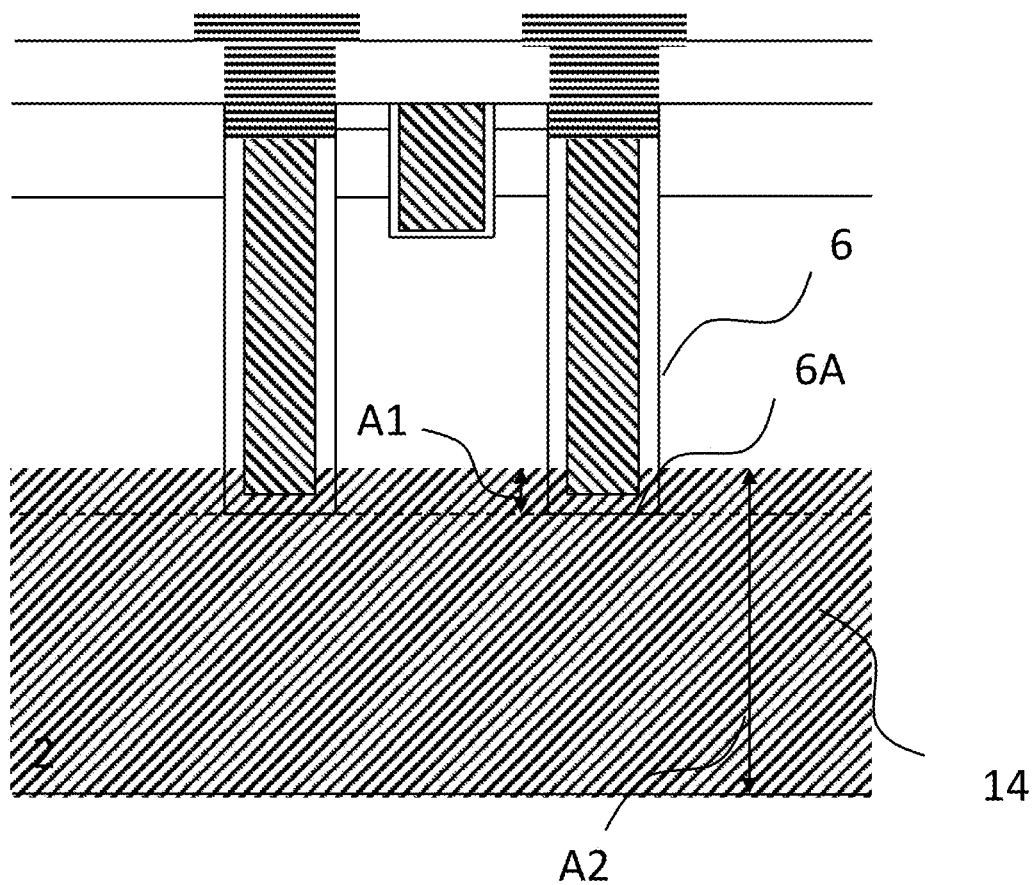
FIG. 2 illustrates a second known trench MOSFET.
Figure 3:
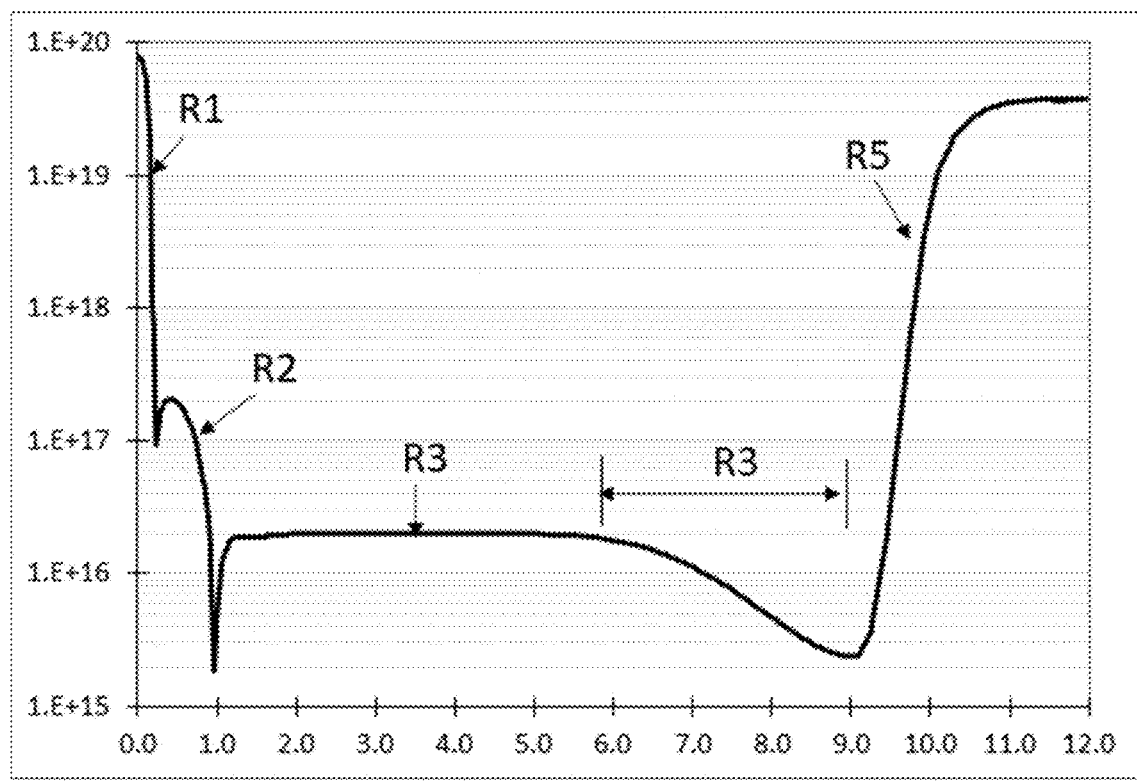
FIG. 3 illustrates a doping concentration characteristic of the trench MOSFET of FIG. 2.
Figure 4:
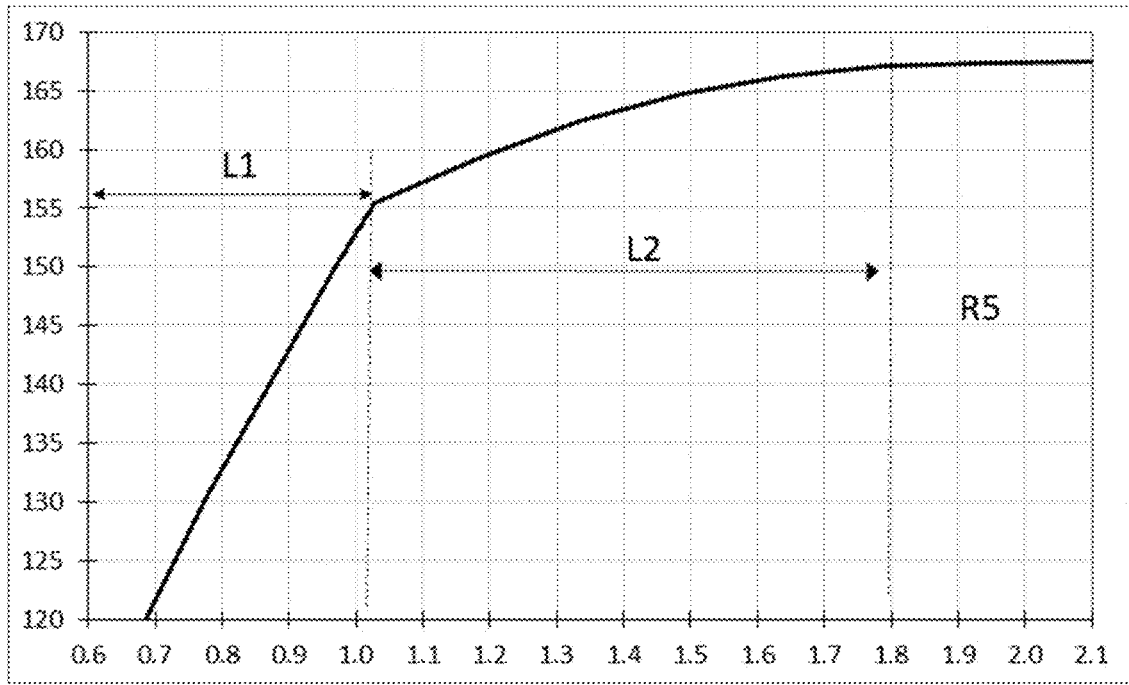
FIG. 4 illustrates the voltage drops inside the trench MOSFET of FIG. 2 close to breakdown.

Similar to FIG. 1, a unit cell 300A can be identified. This unit cell can be repeated to arrange a plurality of these cells next to each other. As shown, adjacent unit cells 300A share a second trench 6. Furthermore, polysilicon bodies 8 and source regions 9 of the plurality of unit cells 300A can be electrically connected to a common source contact (not shown). Similarly, polysilicon bodies 5 of the plurality of unit cells 300A can be electrically connected to a common gate contact (not shown). Typically, a drain contact is formed on the backside of substrate 1. Moreover, typically the common source contact is formed in a region of the device outside of the plurality of unit cells. The same holds for the gate contact. In such embodiments, metal 311 inside unit cells 300A need not be etched and may cover oxide layer 309 in those cells. Patterning of layer 311 in those embodiments occurs outside of the active area of the trench MOSFET.

It should be noted that in the figures above, the structures depicted are not true to scale. More in particular, relative size ratios between various structures or layers cannot be derived from the figures.

Although the present disclosure has been described using detailed embodiments thereof, the present disclosure is not limited thereto. Instead, various modifications to the embodiments are possible without deviating from the scope of the patent application, which is defined by the appended claims and their equivalents.

What is claimed is:

1. A trench metal-oxide-semiconductor field-effect transistor, trench MOSFET, comprising:
    a semiconductor substrate;
    an epitaxial layer of a first charge type arranged on the semiconductor substrate, in which the epitaxial layer is formed;
    a first trench covered on an inside thereof with a gate oxide and filled with a first polysilicon body;
    a pair of second trenches arranged on opposite sides of the first trench;
    wherein the second trenches are deeper than the first trench;
    wherein each second trench is covered on an inside thereof with a liner oxide and is filled with a second polysilicon body;
    a source region of a first charge type; and
    a body region of a second charge type;
    wherein the epitaxial layer comprises a drift region of the first charge type arranged in between the body region and the substrate;
    wherein the source region and body region are each formed in between the first trench and each of the second trenches;
    wherein the body region is arranged in between the source region and the drift region; and
    wherein the trench MOSFET further comprises an ion implantation region of the first charge type formed in the drift region, extending below the second trenches, and being vertically aligned with a base of the second trenches;
    wherein the ion implantation region has an average net dopant concentration that is lower than in a remaining part of the drift region; and
    wherein the ion implantation region also extends between the second trenches near the base of the second trenches.

2. The trench MOSFET according to claim 1, wherein the ion implantation region comprises a first ion implantation sub-region extending away from one second trench among the pair of second trenches, and a second ion implantation sub-region extending away from the other second trench among the pair of second trenches; wherein the first and second ion implantation sub-regions are contiguous; wherein the first ion implantation sub-region comprises dopants of the second charge type that have been implanted through and laterally diffused away from the base of the one second trench among the pair of the second trenches; and wherein the second ion implantation sub-region comprises dopants of the second charge type that have been implanted through and laterally diffused away from the base of the other second trench among the pair of the second trenches.

3. The trench MOSFET according to claim 1, wherein the drift region outside of the ion implantation region has an average doping concentration that is at least 5 times greater than an average doping concentration in the ion implantation region.

4. The trench MOSFET according to claim 1, wherein the ion implantation region of the first charge type formed in the drift region extends below the second trenches at least up to an interface between the epitaxial layer and the substrate.

5. The trench MOSFET according to claim 1, wherein the substrate comprises a silicon substrate of the first charge type; and wherein the first charge type is n-type and the second charge type p-type.

6. The trench MOSFET according to claim 1, wherein the source regions are electrically connected to a source contact of the trench MOSFET; wherein the first polysilicon body is electrically connected to a gate contact; and wherein the second polysilicon bodies are electrically connected to the source contact.

7. The trench MOSFET according to claim 1, comprising a parallel arrangement of a plurality of the first trenches, and each of the plurality of first trenches are arranged in between a respective pair of the second trenches; wherein the first polysilicon bodies in the first trenches are electrically connected to each other; and wherein the second polysilicon bodies in the second trenches are electrically connected to each other.

8. A method for manufacturing a trench MOSFET, comprising the steps of:
    a) providing a semiconductor substrate with an epitaxial layer of a first charge type arranged thereon;
    b) forming a pair of second trenches in the epitaxial layer;
    c) providing a liner oxide to cover an inside of the second trenches;
    d) providing a second polysilicon body in each of the second trenches;
    e) forming a first trench in the epitaxial layer in between the second trenches, the second trenches being deeper than the first trench;
    f) providing a gate oxide to cover an inside of the first trench;
    g) providing a first polysilicon body in the first trench;
    wherein the following steps are taken before providing the second polysilicon bodies:
        implanting dopants of the second charge type through a base of one second trench among the pair of second trenches thereby forming a first ion implantation sub-region and simultaneously implanting dopants of the second charge type through a base of the other second trench among the pair of second trenches thereby forming a second ion implantation sub-region; and performing a driving-in step to allow the implanted dopants to laterally diffuse away from the bases of the second trenches thereby deforming the first and second ion implantation sub-regions so that the sub-regions become contiguous.

9. The method according to claim 8, wherein step b) further comprises:
b1) providing a masking layer on the epitaxial layer and patterning the masking layer;
b2) etching the second trenches in the epitaxial layer through openings in the masking layer;
wherein step b1) preferably comprises:
b11) providing a masking layer on the epitaxial layer;
b12) providing a photoresist layer on the masking layer, and patterning the photoresist layer;
b13) etching the openings in the masking layer through openings in the patterned photoresist layer;
wherein step b11) preferably comprises thermally growing a silicon oxide layer on the epitaxial layer and depositing a silicon nitride layer on the grown silicon oxide layer.

10. The method according to claim 9, wherein step b1) comprises:
b11) providing a masking layer on the epitaxial layer;
b12) providing a photoresist layer on the masking layer, and patterning the photoresist layer;
b13) etching the openings in the masking layer through openings in the patterned photoresist layer.

11. The method according to claim 10, wherein step b11) comprises: thermally growing a silicon oxide layer on the epitaxial layer and depositing a silicon nitride layer on the grown silicon oxide layer.

12. The method according to claim 8, wherein step b) further comprises:
b3) forming a sacrificial oxide layer on an inside of the formed second trenches before performing implanting the dopants of the second charge type through the bases of the second trenches, wherein the sacrificial layer is a silicon oxide layer.

13. The method according to claim 8, wherein the driving-in step comprises an annealing step.

14. The method according to claim 13, wherein the ion implantation region has an average net dopant concentration that is lower than in a remaining part of the drift region; wherein the drift region outside of the ion implantation region has an average doping concentration that is at least 5 times greater than an average doping concentration in the ion implantation region; and/or
wherein the substrate comprises a silicon substrate of the first charge type; and/or
wherein the first charge type is n-type and the second charge type p-type.

15. The method according to claim 8, further comprising the steps of:
h) implanting the epitaxial layer using dopants of the second charge type for forming a body region of the second type between the first trench and each of the second trenches, wherein the epitaxial layer comprises a drift region of the first charge type arranged in between the body region and the substrate;
i) implanting the epitaxial layer using dopants of the first charge type for forming a source region between the first trench and each of the second trenches, wherein the body region is arranged in between the source region and the drift region; and
j) providing a gate contact that is electrically connected to the first polysilicon body and a source contact that is electrically connected to the second polysilicon bodies and the source regions.

* * * * *